United States Patent [19]

Patel

[11] 4,418,459

[45] Dec. 6, 1983

[54] APPARATUS SEPARATING HYBRID SUBSTRATE FROM CARRIER PLATE

[75] Inventor: Gajendra M. Patel, Fremont, Calif.

[73] Assignee: GTE Automatic Electric Incorporated, Northlake, Ill.

[21] Appl. No.: 325,418

[22] Filed: Nov. 27, 1981

Related U.S. Application Data

[62] Division of Ser. No. 129,507, Mar. 11, 1980, Pat. No. 4,360,960.

[51] Int. Cl.³ .............................................. B23P 19/04
[52] U.S. Cl. ...................................................... 29/239
[58] Field of Search ................. 271/42, 128, 280, 286; 414/114, 115, 117, 119, 131; 29/239, 426.1, 426.3, 426.5, 741

[56] References Cited

U.S. PATENT DOCUMENTS

| 3,165,312 | 1/1965 | Stoever ............................. 271/42 X |
| 3,749,385 | 7/1973 | Ogawa et al. ................... 414/119 X |
| 3,806,113 | 4/1974 | Gronlund-Nielsen .......... 271/128 X |

FOREIGN PATENT DOCUMENTS 801232  9/1958  United Kingdom .................. 29/741

OTHER PUBLICATIONS

Western Electric Technical Digest No. 21, Jan., 1971 p. 33, Article by G. J. Plichta et al.

*Primary Examiner*—Howard N. Goldberg
*Assistant Examiner*—C. J. Arbes
*Attorney, Agent, or Firm*—Russell A. Cannon

[57] ABSTRACT

Stacked leaded hybrid substrates and associated carrier plates are exited from a reflow solder operation onto a vibrating table. Vibration of the table sequentially advances each stacked carrier and substrate until components on the latter contact an arm that is spaced above the table. Detection of the presence of a substrate and carrier adjacent the arm causes a plunger to move transversely across the table and into contact with an edge of the substrate. Further movement of the plunger pushes an edge of the carrier into contact with spring loaded pins in the table top. The shear force created on contiguous surfaces of the substrate and carrier by the plunger and pins causes the substrate to slide off of the carrier and over the pins. If this shear force exceeds a prescribed value, the pins rotate into the table top for passing a carrier and/or substrate without damaging the latter. In an alternate embodiment, separation is accomplished with a rotating brush that moves only substrates stacked on a carrier plate over an elongated bar on the table top.

3 Claims, 7 Drawing Figures

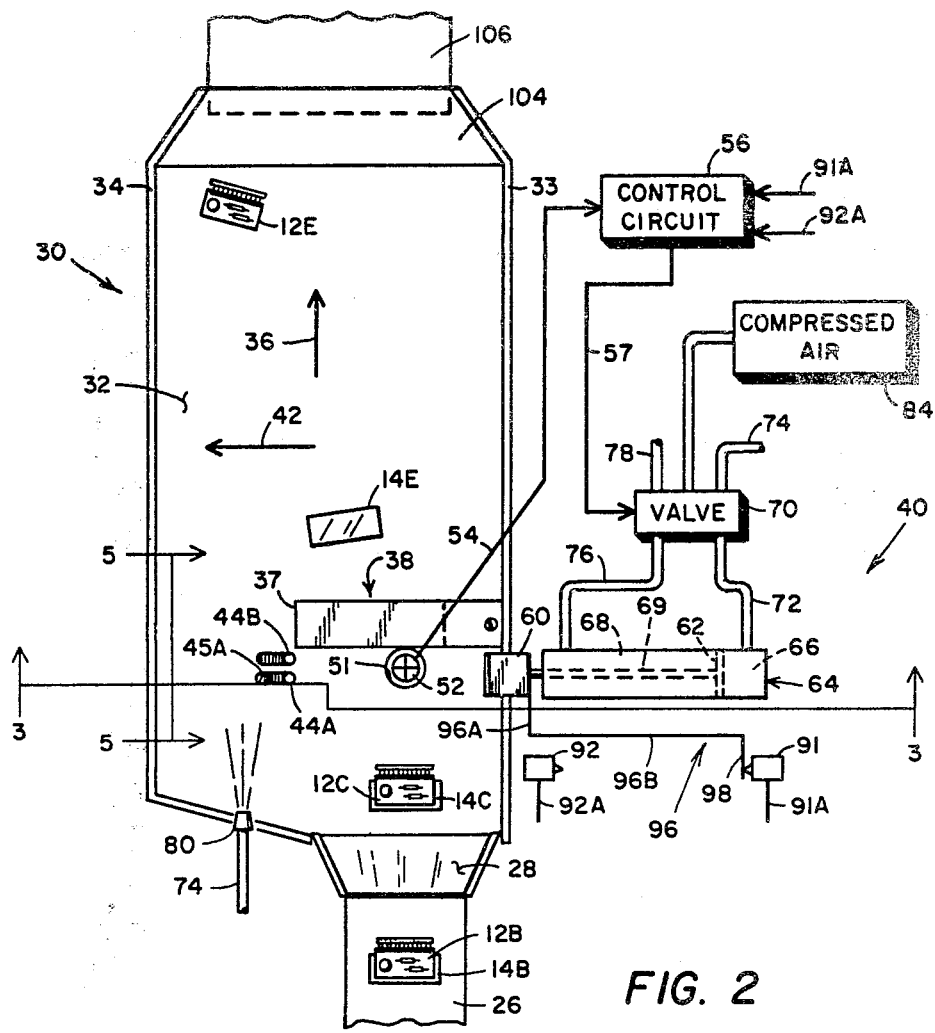
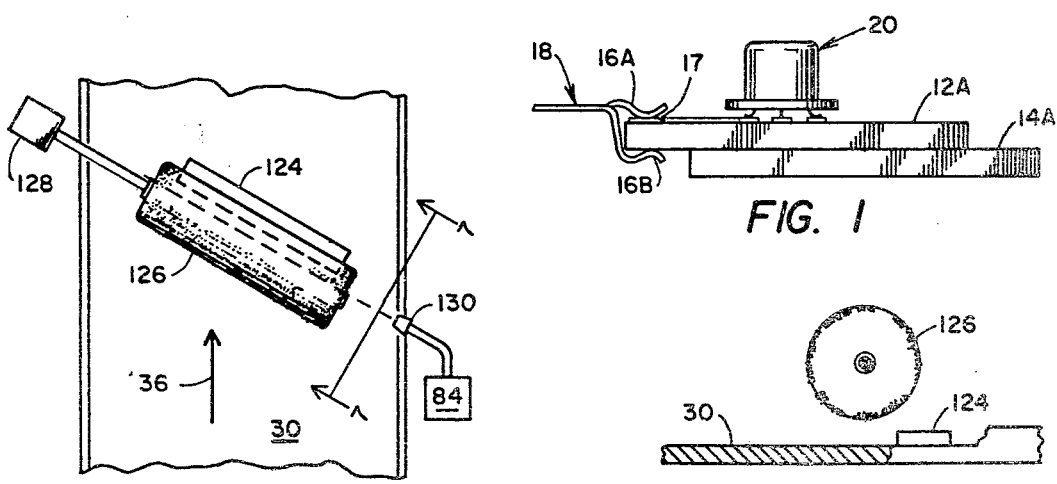
FIG. 2
FIG. 6
FIG. 1
FIG. 7

APPARATUS SEPARATING HYBRID SUBSTRATE FROM CARRIER PLATE

This is a division, of application Ser. No. 129,507, Mar. 11, 1980, now U.S. Pat. No. 4,360,960 issued Nov. 30, 1982.

BACKGROUND OF INVENTION

This invention relates to the manufacture of hybrid substrates and more particularly to apparatus for separating leaded hybrid substrates from carrier support plates following a reflow solder operation.

Electrical components are permanently electrically connected in thick film hybrid circuits by locating the flat bottoms of hybrid substrates carrying circuit patterns and components on a conveyor belt that moves them through a reflow solder operation. In order to simultaneously connect the components and tines of leads into a hybrid circuit, the flat bottom of a hybrid substrate is flush mounted on the flat top of a thin aluminum support plate or carrier, with tines on the substrate bottom offset from the carrier. During the subsequent reflow solder operation, solder flux associated with the tines melts and flows along the bottom of the substrate and into the opening between it and the carrier plate. As the stacked substrate and plate move away from the heat zone in the reflow solder operation, the melted solder begins to solidify. This causes a substrate and associated carrier plate to stick together. If these parts are allowed to cool such that the solder flux solidifies into a paste, it is extremely difficult to separate them. Although stacked substrates and carriers may be passed directly from a reflow solder operation to a cleaning and defluxing operation, it has been found that many of the cleaned parts are still stuck together. A human operator must then pry each substrate from the associated carrier and again pass them through a cleaning and defluxing operation. Since this hand operation must be performed on individual substrates, it is time consuming and expensive. An object of this invention is the provision of apparatus for separating hybrid substrates from associated carrier plates following a reflow solder operation.

SUMMARY OF INVENTION

In accordance with this invention, a leaded hybrid substrate is separated from a heat conductive carrier plate to which it is stuck by solder flux between flat surfaces thereof following a reflow solder operation by creating a shear force along these surfaces. This is accomplished by first means producing a force for moving one of the substrate and carrier plate in one direction that is in a plane substantially parallel to the flat surfaces, and second means restricting movement of the other one of the substrate and plate in the one direction. In one embodiment, separation is accomplished with a rotating brush that sweeps only substrates stacked on a carrier plate over an elongated bar that is attached to the flat top of a table.

DESCRIPTION OF DRAWINGS

This invention will be more fully understood from the following detailed description of preferred embodiments thereof, together with the drawings in which:

FIG. 1 is an enlarged end view of a leaded hybrid substrate 12A and carrier plate 14A stacked for processing in a reflow solder operation;

FIG. 2 is a plan view of a schematic representation of a preferred embodiment of this invention;

FIG. 6 is a plan view of a schematic representation of an embodiment of this invention including a rotating brush 126 and stop bar 124; and FIG. 7 is a section view in FIG. 6 taken along the axis of the brush.

Figure 3:
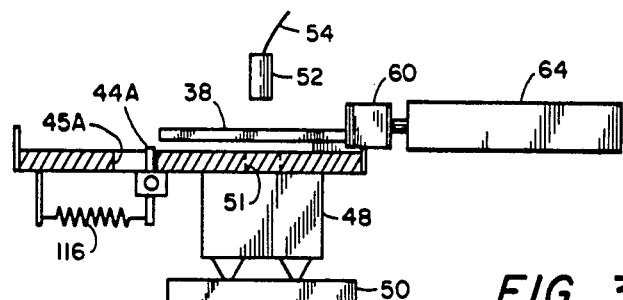
FIG. 3 is a section view of the apparatus in FIG. 2 taken along section lines 3—3.

The drawings in the various figures are not drawn to scale, for the sake of clarity of illustration.

DESCRIPTION OF PREFERRED EMBODIMENTS

The hybrid substrates 12 in the figures are conventional. The substrate 12A in FIG. 1 has a plurality of conductive lands and lead patterns (not shown) formed on the top surface thereof. In the manufacture of a hybrid circuit on the substrate, tines 16 of a lead frame 18 are pressed over one side of the substrate and onto conductive lands 17 there. The tines 16B project approximately 0.028 inch below the flat bottom of the substrate. After paste solder is screened onto the conductive lands, terminals of components such as a transistor 20 (as well as a resistor 22 and chip capacitor 24 in FIG. 4) are located in the paste solder. The leaded substrate 12A is then set on a heat conductive carrier plate 14A, with the leaded edge of the substrate offset from the plate so that the flat bottom and top surfaces thereof are flush. The substrate is formed of a high alumina ceramic material and may measure 0.75 inch × 2.0 inches × 0.030 inch thick. The carrier plate is made of a good heat conductive material such as aluminum and may measure 1.0 inch × 2.5 inches × 0.040 inch thick. The carrier plate is made of a material having stable dimensions so that it does not warp during repeated passages through a furnace. The camber in the plate is preferably less than 0.003 inch. The components and lead tines are permanently electrically connected into the substrate circuit by placing the stacked carrier plate and substrate on an endless belt 26 that carries them through a reflow solder operation (not shown). During heating of the plate and substrate, flux in the solder paste around tines 16A melts and flows along the bottom of the substrate and into the crack between it and the plate. This solder flux causes the substrate and plate to stick together along the contiguous flat surfaces thereof.

Referring now to FIG. 2, a preferred embodiment of this invention for automatically separating a substrate from a carrier plate comprises a vibrating table 30 having a flat top 32 on which substrates and plates move in a first direction indicated by the arrow 36; an arm 38 extending part way across the table top for blocking the passage of a stacked substrate and plate in the first direction; a pneumatically actuated propulsion mechanism 40 for moving a stacked substrate and plate in a second direction that is transverse to the first direction and is indicated by the arrow 42; and an overload mechanism including a pair of pins 44 for limiting the movement of a plate in the second direction. The table 30 is attached to a Syntron vibrator 48 that is mounted on a base plate 50 (see FIG. 3). The operation of the vibrator causes stacked and separated substrates and plates on the table to move in the first direction. Sides 33 and 34 keep substrates from falling off the table.

The table 30 is positioned in line with the endless belt 26 that carries stacked substrates and plates from a reflow solder operation. Substrates and plates are preferable loaded onto the belt 26 with leads facing in the first direction. Alternatively, the leads may face in the direction opposite to the first direction. The belt is in an elevated position so that a substrate and associated plate 14B on the belt slide down a ramp 28 and onto the table top with substrate leads generally facing in the first direction. Vibration of the table moves the stacked substrate and plate 14C along the table top and toward the arm 38. This arm is rigidly attached to the table at the extreme right side thereof (see FIG. 2) by screws that extend through shims and into the table. The left side of the arm is spaced a prescribed distance D above the table top (see FIG. 5) that is preferably only slightly greater than the thickness of the plate plus that of the substrate and tines 16A on the latter. This spacing D then causes components on a stacked substrate and plate to contact the front 39 of the arm for preventing these parts passing under it. In practice, the spacing D is adjusted by varying the number of shims between the bottom of the arm and the table top. This height D can also be adjusted so that a substrate edge or leads 18 contact the front of the arm instead of it contacting a component on the substrate. Unfortunately, a separated substrate in the place of a stacked substrate 12D and plate 14D will not pass under the arm since the height of transistors 20 is normally greater than that of a carrier plate and substrate.

Figure 4:
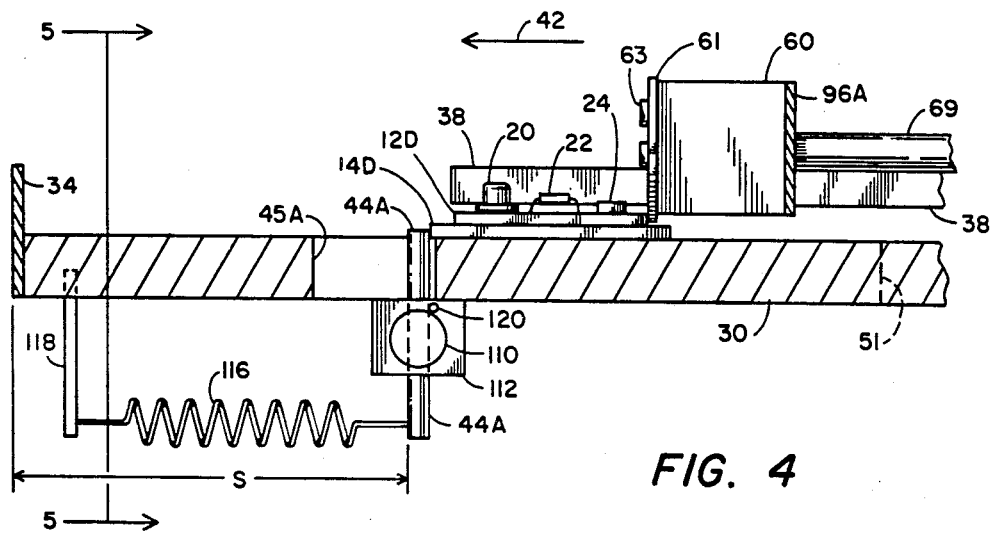
FIG. 4 is an enlarged view of a portion of FIG. 3, with a staked substrate and carrier plate adjacent the arm 38 and the plunger 60 extended to push the substrate sufficiently to force the edge of the carrier plate against pins 44.
Figure 5:
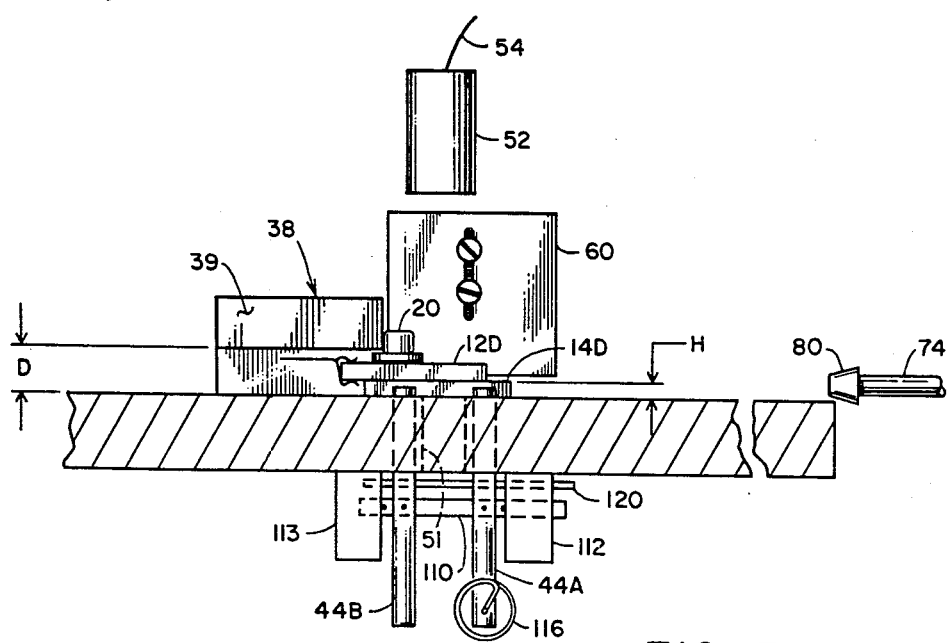
FIG. 5 is a section view taken along lines 5—5 in FIG. 4.

The pins 44 are located in the table top in front of the arm 38 and adjacent the end 37 thereof (see FIGS. 2, 4 and 5). These pins are spaced a prescribed distance S from the left side 34 of the table that is greater than the broadest overall dimension of the substrate and leads 18 thereon (see FIG. 2). They also project above the table top a prescribed height H that is less than the thickness of a carrier plate 14D (see FIG. 5). The pins 44 may be rigidly mounted in the table. Alternatively, the pins may be spring loaded and rotatably mounted in the table as is described more fully hereinafter.

In order to detect the presence of stacked substrates and plates, a hole 51 is drilled through the table in front of the arm 38 and the photodetector 52 located above it. The photodetector is commercially available from Scan-A-Matic Corporation. When a reflective element such as a substrate and associated plate 14D move over the hole (see FIG. 5), the photodetector is activated for producing a signal on line 54 that is connected to a control circuit 56.

The propulsion mechanism 40 comprises a plunger 60 that is connected to the piston 62 in a cylinder 64, a four-way directional air valve 70 that controls the passage of compressed air from a source 84 to and from chambers 66 and 68 of the cylinder, microswitches 91 and 92 for detecting the travel of the plunger, and the control circuit 56. The cylinder 64 is oriented for locating the plunger adjacent the arm 38 and the table top as it moves across the latter (see FIGS. 5 and 4). A pad 61 (See FIG. 4) that is made of a soft material such as neoprene rubber is attached to the flat front of the plunger. Screws 63 are provided for adjusting the spacing between the bottom of the pad 61 and the table top so as to be slightly greater than the thickness of the plate 14D. This causes the pad to contact the edge of a substrate 12D (rather than components on it or the plate) when the plunger is extended (see FIG. 4). The plunger has a flange 96 connected to the rear thereof. The arm 98 on the flange is substantially parallel to the front of the plunger for providing an indication of the position thereof. In an actual embodiment of the invention in FIGS. 2–5, the cylinder 64, microswitches 91 and 92, and photo detector 52 may be attached to a U-shaped support bar (not shown) that extends over the top of the table and is attached to the base plate 50 in FIG. 3.

In operation, vibration of the table causes a stacked substrate and plate 14C to advance along the table top until components on the substrate contact the arm 38. As a substrate moves over the hole 51 in the table, the photodetector 52 is activated for producing a control signal on line 54. The circuit 56 is responsive to this signal for causing the valve to connect compressed air from source 84 to the rear chamber 66 and to open the forward chamber to the atmosphere through tube 78. The circuit 56 is thereafter insensitive to the output of the photodetector, until the microswitch 91 is subsequently actuated. The compressed air in the chamber 66 causes the plunger to move transversely for contacting a non-leaded edge of a substrate 12D stacked on an associated plate 14D and adjacent the arm 38 for moving them in the second direction across the table top (see FIG. 4).

The plunger moves the substrate and plate transversely until the latter is stopped by pins 44 (see FIG. 4). These pins 44 supply a holding force for the plate, which is for a time equal and opposite to that provided by the plunger. This creates a shear force along the contiguous surfaces of the substrate and plate. As the pressure in the cylinder increases, the force of the plunger pushing on the substrate, and the resultant shear force, increases until the adhesion or bond created by the solder flux breaks. The pressure of air in the source 84 is selected to provide a force to plunger 60 which is greater than that required to break the bond established by the solder flux. The plunger then continues movement in the transverse direction in FIG. 4 until the substrate clears the pins and the arm 98 associated with the plunger actuates microswitch 92. The control circuit is responsive to activation of this switch for now producing a signal that causes valve 70 to connect compressed air to the forward chamber 68 and exhaust the rear chamber into a tube 74 that is connected to a nozzle 80 at the front of the table. This nozzle 80 is located on the left of the pins and is aimed so as to exhaust a stream of air along the table top. As compressed air rushes into the forward chamber, the plunger rapidly moves to its original position in FIG. 2 for actuating the microswitch 91 which again renders the control circuit responsive to the operation of the photodetector. This movement of the plunger also causes a blast of air to be exhausted from the nozzle 80 for abruptly moving a separated substrate on the left of the pins 44 and 45 in FIG. 2 in the first direction and away from an associated carrier plate immediately following separation therefrom. The separated plate then moves under the arm 38 toward the rear of the table. Continued vibration of the table moves separated substrates 12E and plates 14E onto a ramp 104 and a second endless belt 106 that carries them to a cleaning and defluxing operation (not shown).

It has been observed that in some instances a substrate may become separated from an associated carrier plate as they slide down the ramp 28 and onto the table top. Although the separated plate will pass under the arm 38, the separated substrate will be stopped by this arm and its presence detected by the photoelectric device 52. This causes the plunger to move to the left in FIG. 2 and the pad 61 to push on components soldered on the top of the substrate until the edge of the latter contacts the pins 44. In order to prevent damage to components, the pins are preferably releasibly held in the table so that components of the hybrid circuit on a separated substrate are not damaged by actuation of the plunger. The pins 44 are rotatibly mounted in the table by a shaft 110 that extends through the pins and into support blocks 112 and 113 that are rigidly attached to the underside of the table (see FIG. 5). A spring 116 is stretched between the bottom of the pin 44A and a rod 118 located in the table for exerting a restraining force on the pins that returns them to their upright position in the table (see FIG. 4). A rod 120 extends through the support blocks for initially holding the pins in an upright position in the table. Elongated slots 45A and 45B are milled in the table for allowing the associated pins to lay over until they are below the top of the table. In operation, when the force exerted on the pins by the plunger 60 pushing components on a substrate (or the edge of a substrate or plate) exceeds a prescribed value established by the spring 116, increased force translated to the pins by the plunger causes them to gradually rotate into the associated openings. In this manner, a separated substrate may be released from contact with the pins prior to components on the substrate being damaged by movement of the plunger. The amount of restraining force desired for the spring, in order to accomplish separation of stacked substrates and plates without damaging soldered components on a separated substrate, is readily determined empirically and has been found to be approximately three pounds of force.

In the embodiment of this invention illustrated in FIGS. 6 and 7, an elongated bar or stop member 124 having a height that is much less than the thickness of the carrier plate is located at an angle of approximately 45 degrees to the direction of travel indicated by the arrow 36. A rotating brush 126 is located in front of the bar 124 with the ends of bristles spaced a short distance above the top of the bar. A motor 128 rotates the brush in counter-clockwise in FIG. 7 so that the soft ends of bristles contact a stacked substrate and/or components thereon for causing the substrate to move the associated carrier plate (preferably below the tines 16B) against the leading edge of the bar 124 and sweep the stacked substrate over and beyond the bar. A nozzle 130 exhausts a stream of compressed air immediately adjacent the table top and front edge of the bar 124 for moving carrier plates there transversely and away from the bar.

Although this invention is described in relation to preferred embodiments thereof, variations and modifications will occur to those skilled in the art. By way of example, a plurality of photodetectors and associated holes in the table may be located side by side in front of the arm 38. Also, a second plunger mechanism may be located on the left side of the table so as to cause forces to be exerted in opposite directions on opposite edges of a stacked substrate and plate, instead of using pins 44 in the table. Further, the pins may be located in the position of the arm 38 and an arm rotated in a clockwise direction in FIG. 2 for pushing substrates in the first direction and beyond the pins. Also, the portion 96B of the flange 96 may extend down to the top surface of the table and through the side 33 thereof for preventing forward movement of stacked substrates and plates 14C when the plunger is extended. Additionally, movement of a stacked substrate can be limited and an associated carrier plate pushed out from under it. Also, apparatus may be located on the table for fixing the direction in which substrates orient themselves when they slide off of the ramp 28 and onto the table top. And other structure may be provided to sense the presence of a separated plate or substrate adjacent the bar 124 and other means such as a push rod or pin used to move it away from the stop bar. This invention in FIGS. 2–5 is also applicable for separating dual in-line package type substrates (having leads on opposite sides of the substrate and pointed at 90° to the broad surfaces thereof) from a carrier plate. The scope of this invention is therefore defined by the appended claims rather than the aforementioned descriptions of preferred embodiments.

What is claimed is:

1. Apparatus for separating a leaded hybrid substrate from a heat conductive carrier plate that it is sitting on, the flat bottom of the substrate being contiguous with and stuck to the flat top surface of the plate by solder flux following a reflow solder operation, comprising:

first means for creating a first force on one of the substrate and plate for moving said one of the substrate and plate in one direction, said first force being in a plane substantially parallel to the contiguous surfaces; and second means creating a second force on the other one of the substrate and plate for moving it in a direction generally opposite to the one direction so as to create a shear force in the one direction along the contiguous surfaces of the plate and substrate.

2. Apparatus for separating a leaded hybrid substrate from a heat conductive carrier plate that it is sitting on, the flat bottom of the substrate being contiguous with and stuck to the flat top surface of the plate by solder flux following a reflow solder operation, comprising:

first means for creating a force on one of the substrate and plate for moving said one of the substrate and plate in one direction, said force being in a plane substantially parallel to the contiguous surfaces;

second means for restricting movement of the other one of the substrate and plate in the one direction so as to create a shear force in the one direction along the contiguous surfaces of the plate and substrate; and a work table having a flat top, the flat bottom of the plate resting on the flat top of the work table; said second means comprising a stop member in a fixed position on the table top and projecting a prescribed distance above it that is less than the thickness of the plate; said first means producing a pressure force in the one direction on at least one of the edges of the substrate that is opposite the leaded edge thereof and a component on the substrate for forcing an edge of the plate that is adjacent the leaded edge of the substrate against said stop member for creating a shear force in the one direction along the contiguous surfaces and restricting movement thereof in the one direction so as to enable separation of the substrate and plate along the broad contacting surfaces thereof when the pressure force exceeds that exerted on the plate by said stop member.

3. Apparatus according to claim 2 wherein said first means comprises a cylindrical brush supported above said table top and adjacent said stop member so as to contact components on a substrate sitting on a plate, said brush rotating so as to move a stacked substrate and plate in the one direction and the plate edge that is adjacent a leaded edge of the substrate into contact with said stop member for passing the substrate over the latter.

* * * * *